United States Patent [19]

Morikawa

[11] Patent Number: 5,258,658

[45] Date of Patent: Nov. 2, 1993

[54] GAMMA CORRECTION CIRCUIT

[75] Inventor: Hiroyuki Morikawa, Tenri, Japan

[73] Assignee: Sharp Kabushiki Kaisha, Osaka, Japan

[21] Appl. No.: 875,811

[22] Filed: Apr. 30, 1992

[30] Foreign Application Priority Data

Jul. 26, 1991 [JP] Japan ................... 3-187751

[51] Int. Cl.$^5$ .................. H03K 5/01; H03K 5/12
[52] U.S. Cl. .................. 307/264; 307/263; 307/268; 307/494
[58] Field of Search ............ 307/268, 491, 494, 490, 307/263, 264; 328/185, 187, 183; 358/164, 32; 359/246, 249

[56] References Cited

U.S. PATENT DOCUMENTS

| | | | |
|---|---|---|---|
| 5,136,184 | 8/1992 | Deevy | 307/263 |
| 5,177,374 | 1/1993 | Carpenter et al. | 307/263 |
| 5,189,313 | 2/1993 | Garuts | 328/185 |

*Primary Examiner*—John Zazworsky

[57] ABSTRACT

A gamma correction circuit including a differential amplifier for generating a current which decreases as an input voltage increases; a current control circuit for generating a current which is zero when the input voltage is below a first set value, increases as the input voltage increases when the input voltage is in a range from the first set value and a second set value, and becomes constant when the input value exceeds the second set value; and a circuit for generating a voltage proportional to a sum of the above-mentioned currents.

4 Claims, 5 Drawing Sheets

GAMMA CORRECTION CIRCUIT

BACKGROUND OF THE INVENTION

1. Field of the Invention

This invention relates to a gamma correction circuit.

2. Description of the Related Art

In a liquid crystal display device, for example, the relation between an applied voltage and a transmittance of a liquid crystal is non-linear as shown in FIG. 5. In order to obtain a linear relation between a video signal and the transmittance of the liquid crystal, it is necessary to make a correction by using a circuit having a characteristic as shown in FIG. 6. FIG. 7 shows an example of a gamma correction circuit for a liquid crystal display device, which is intended for the above-mentioned correction. The transistors Q21 and Q22, resistors R21 and R22, and constant-current circuits I21 and I22 constitute an amplifier, and a voltage inputted to the base of the transistor Q21 is amplified and outputted from the collector of the transistor Q22. The amplification factor of this amplifier is substantially R21/R22. (Hereafter, the resistance values of the resistors are expressed by their reference numerals.)

When an input voltage VIN increases and an resulting output voltage VO exceeds a base voltage VA of the transistor Q25, the transistor Q23 turns on. Consequently, the resistor R23 is connected in parallel with the resistor R21, so that the value of a load resistor of the transistor Q22 becomes R21·R23/(R21+R23), with the result that the amplification factor of the amplifier becomes R21·R23/{(R21+R23)·R22}. That is to say, when the output voltage Vo exceeds the voltage VA, the amplification factor is compressed by R23/(R21+R23).

As the output voltage VO increases further, the current flowing through the resistor R23 increases, causing the current flowing through the resistor R24 to increase, and therefore, the base voltage of the transistor Q24 rises. When this base voltage becomes larger than the voltage VB, the collector current of the transistor Q26 decreases, so that the base current of the transistor Q23 decreases. As a result, the collector current of the transistor Q23 decreases, and the base voltage of the transistor Q24 falls. In this way, the base voltage of the transistor Q24 is stabilized at the voltage VB and remains unchanged even though the output voltage VO exceeds the voltage VB. In other words, the collector current of the transistor Q23 is made constant and the resistor R23 is isolated electrically from the amplifier. As a result, the amplification factor of the amplifier returns to the original value R21/R22.

FIG. 8 shows an input/output characteristic of this prior gamma correction circuit whose amplification factor changes with the value of the input voltage.

In such a prior gamma correction circuit, since the circuit comprising the resistor R23 and the transistor Q23 is connected to the output of the amplifier, that is, to the collector of the transistor Q22, a frequency characteristic of the gamma correction circuit is deteriorated by its parasitic capacitance compared with a case in which its load is only the resistor R21. Another problem is that the phase characteristic is changed since the value of the load is changed with the change of the level of the input signal, accordingly with the change of the output signal.

SUMMARY OF THE INVENTION

It is therefore an object of the present invention to provide a gamma correction circuit which solves the above problems, which has an excellent frequency characteristic, and which keeps the phase characteristic unchanged without being affected by the level of the input signal.

In order to achieve the above object, the gamma correction circuit of the present invention comprises first means for generating a first current which decreases as an input voltage increases; second means for generating a second current which is zero when the input voltage is below a first set value, increases as the input voltage increases when the input voltage is in a range from the first set value to a second set value, and becomes constant when the input voltage exceeds the second set value; and third means for generating a voltage proportional to a sum of the first and second currents.

In the gamma correction circuit according to the present invention, such a circuit that will cause a capacitance to parasitize the output is not added and the value of the load resistance does not change, so that the frequency characteristic is excellent and the phase characteristic is not changed by the change of the level of the input signal.

Further objects and advantages of the present invention will be apparent from the following description of the preferred embodiment of the invention as illustrated in the accompanying drawings.

DESCRIPTION OF THE PREFERRED EMBODIMENT

Figure 1:
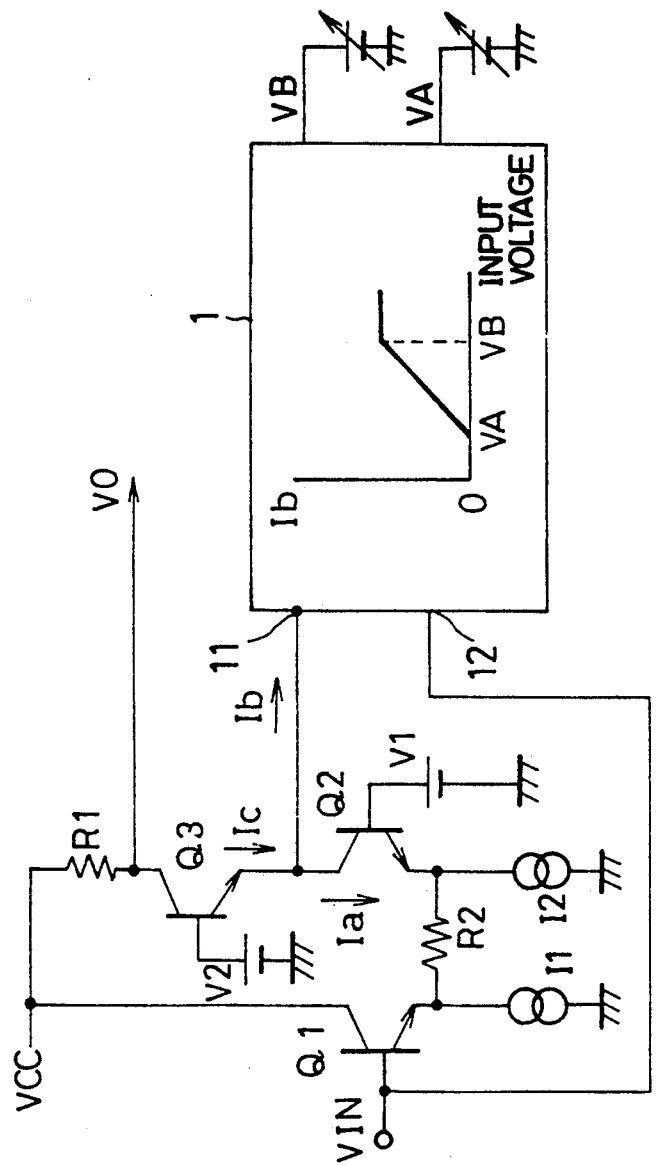
FIG. 1 is a circuit diagram of an embodiment of the gamma correction circuit according to the present invention.

A preferred embodiment of the present invention will be described with reference to the accompanying drawings. FIG. 1 is an embodiment of the gamma correction circuit according to the present invention. Transistors Q1 and Q2 constitute a differential amplifier. The emitters of the transistors Q1 and Q2 are connected with each other by a resistor R2, and are respectively connected to one ends of constant-current circuits I1 and I2. The other ends of the constant-current circuits I1 and I2 are connected to a ground line. The collector of the transistor Q1 is connected to a power supply Vcc, and an input signal to be corrected is supplied to the base of the transistor Q1. A constant voltage V1 is applied to the base of the transistor Q2.

A resistor R1 is a load resistance of the transistor Q2. One end of the resistor R1 is connected to the power supply Vcc, and the other end is connected to the collector of a transistor Q3. The emitter of the transistor Q3 is connected to the collector of the transistor Q2. A constant voltage V2 is applied to the base of the transistor Q3. The collector of the transistor Q3 serves as the output of the gamma correction circuit.

Figure 3:
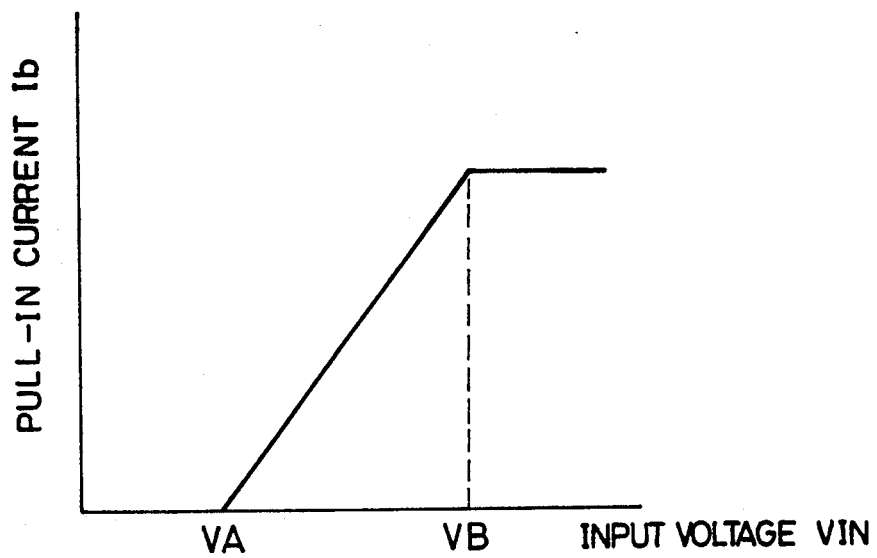
FIG. 3 is a graph showing a current pull-in characteristic of a current control circuit of the gamma correction circuit of FIG. 1.

Reference numeral 1 denotes a current control circuit one input terminal 12 of which is connected to the base of the transistor Q1, and the other input terminal 11 of which is connected to the collector of the transistor Q2. This current control circuit 1 has a characteristic shown in FIG. 3. More specifically, when the input voltage is lower than VA, a pull-in current Ib flowing through the terminal 11 is zero. When the input voltage is in a range from VA to VB, the pull-in current Ib proportional to the input voltage flows from the terminal 11. When the input voltage exceeds VB, the current Ib is saturated and does not increase any more.

Figure 2:
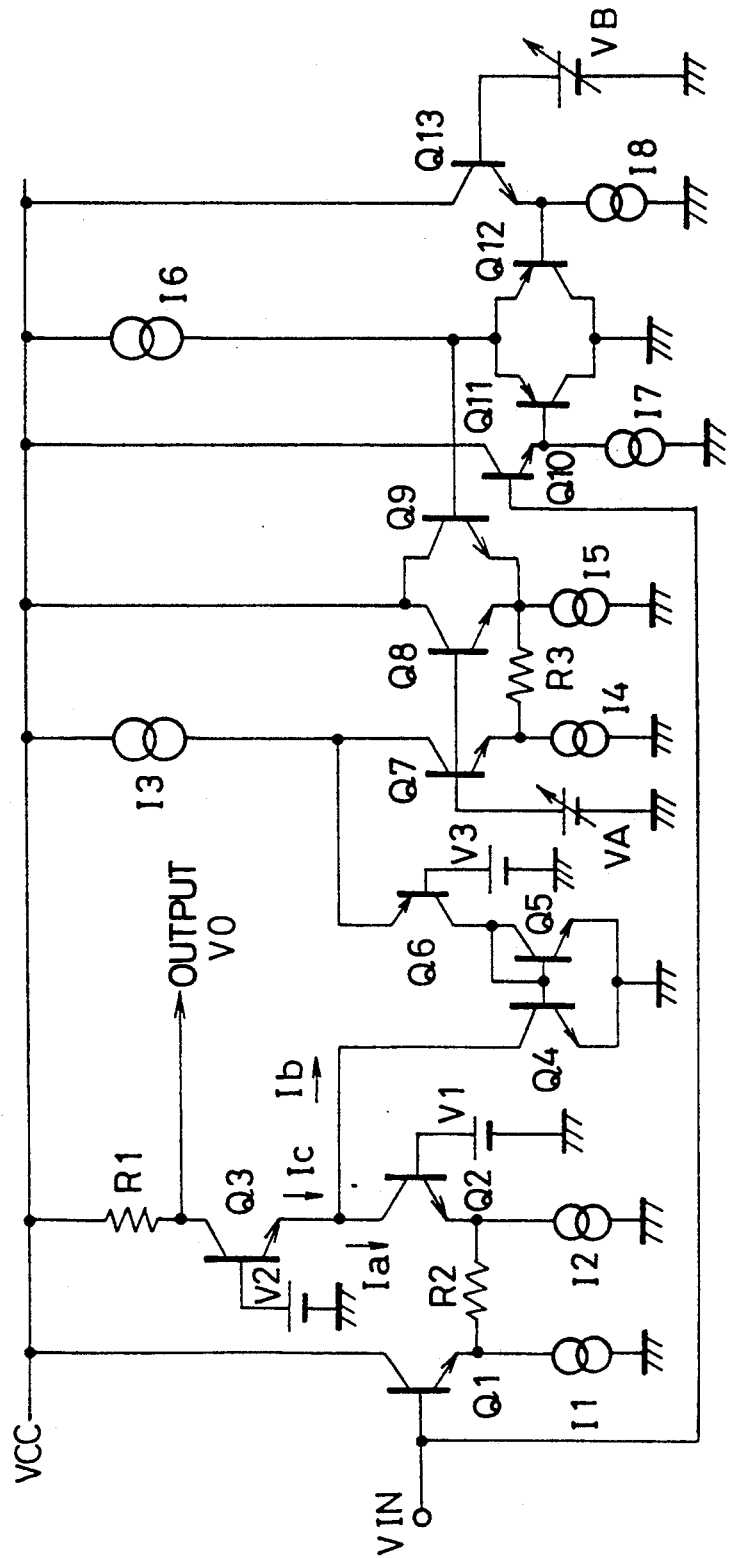
FIG. 2 is a circuit diagram showing a concrete circuit arrangement of the gamma correction circuit of FIG. 1.

FIG. 2 shows the gamma correction circuit showing a concrete circuit arrangement of the current control circuit 1. The input voltage VIN is applied to the base of a transistor Q9 through a transistor Q10 connected to a constant-current circuit I7 and a transistor Q11 connected to a constant-current circuit I6. When the applied voltage is lower than VA, the transistor Q9 does not turn on. Constant-current circuits I3 to I5 are set such that the values of the currents flowing through them respectively are equal to each other, so that no current flows to a resistor R3 and a transistor Q6. Hence, no current flows to transistors Q4 and Q5 constituting a current mirror circuit, and the current Ib is zero.

When the input voltage VIN is higher than VA and lower than VB, the base voltage of the transistor Q9 becomes higher than VA. Consequently, the transistor Q9 turns on, and the transistor Q8 turns off. Under this condition, a current which increases with the increase of the base voltage of the transistor Q9, that is, with the increase of the input voltage VIN, flows through the resistor R3 in the direction from the emitter of the transistor Q9 to the emitter of the transistor Q7. Accordingly, the collector current of the transistor Q7 decreases. In consequence, a current having the value equal to the difference between the current flowing through the constant-current circuit I3 and the collector current of the transistor Q7 flows to the transistor Q6, and a current of the same value flows as the pull-in current Ib to the collector of the transistor Q4. At this time, if a variation of the input voltage is denoted by Δ VIN, the variation Δ Ib of the current Ib is Δ VIN/R3.

When the input voltage VIN increases further and exceeds VB, the transistor Q11 turns off and the transistor Q12 turns on. In consequence, the voltage Vb is applied to the base of the transistor Q9 by the transistor Q13 connected to the constant-current circuit I8. Since this voltage is constant, the current flowing through the resistor R3 does not increase, so that the current Ib becomes constant.

As has been described, when the input voltage VIN is lower than VA, the current Ib flowing to the current control circuit 1 is zero, and therefore, the emitter current Ic of the transistor Q3 is equal to the collector current Ia of the transistor Q2. Hence, the amplification factor is substantially R1/R2.

When the input voltage VIN is higher than VA and lower than VB, the current Ib proportional to the input voltage VIN flows to the current control circuit 1. If the variation of the input voltage is denoted by Δ VIN, a current having the value of Δ VIN/R2 flows to the resistor R2, so that the variation Δ Ia of the collector current Ia of the transistor Q2 equals to $-\Delta$ VIN/R2. Since the variation Δ Ib of the current Ib is Δ VIN/R3 as described above, the variation Δ Ic of the emitter current Ic of the transistor Q3 is given as follows:

$$\Delta Ic = \Delta Ia + \Delta Ib$$
$$= -\Delta VIN/R2 + \Delta VIN/R3$$
$$= \Delta VIN(R2 - R3)/(R2 \cdot R3)$$

Therefore, the variation Δ VO of the output voltage is given as follows:

$$\Delta VO = -R1 \cdot \Delta Ic$$
$$= -R1(R2 - R3)/(R2 \cdot R3) \cdot \Delta VIN$$
$$= R1/R2 \cdot (R3 - R2)/R3 \cdot \Delta VIN$$

From the above expression, it is understood that the amplification factor Δ VO/Δ VIN changes from R1/R2 to R1/R2. (R3−R2)/R3. That is to say, it is compressed by (R3−R2)/R3.

Figure 4:
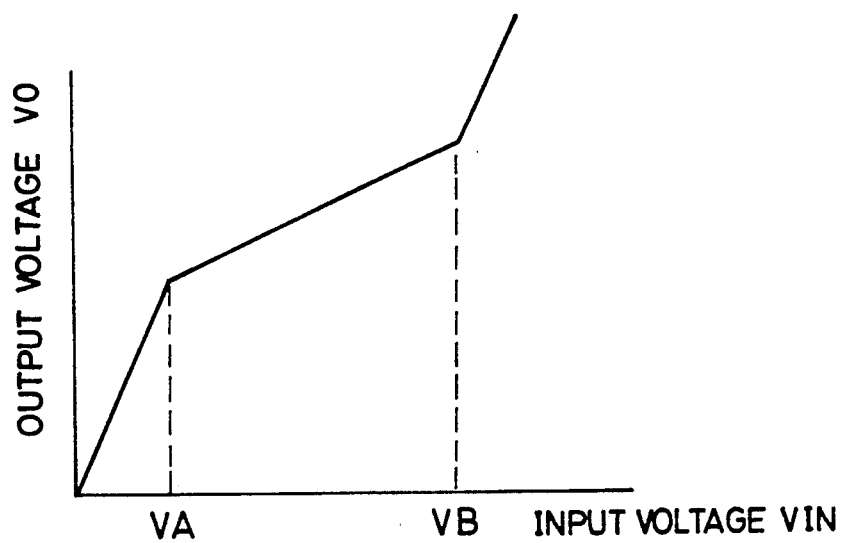
FIG. 4 is a graph showing an input/output characteristic of the gamma correction circuit of FIG. 1.
Figure 5:
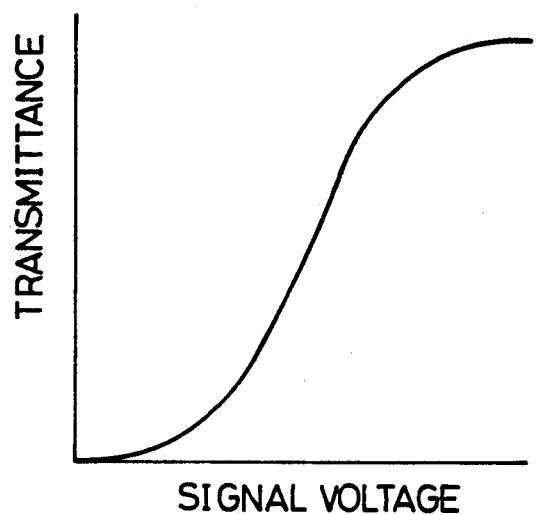
FIG. 5 is a graph showing a relation between an applied voltage and a liquid crystal transmittance in a liquid display device.
Figure 6:
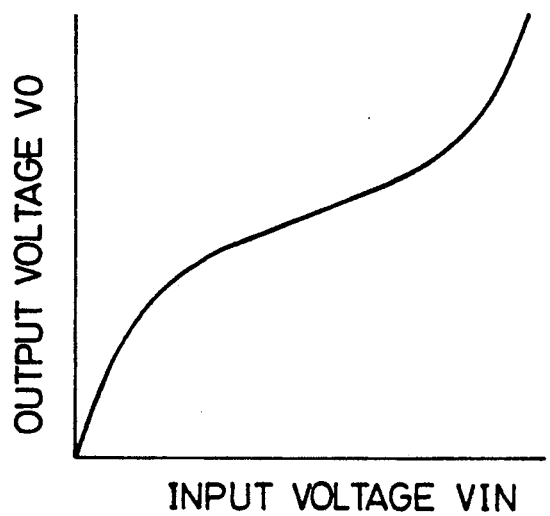
FIG. 6 is a graph showing a gamma correction characteristic according to which the relation between the applied voltage and the liquid crystal transmittance is corrected.
Figure 7:
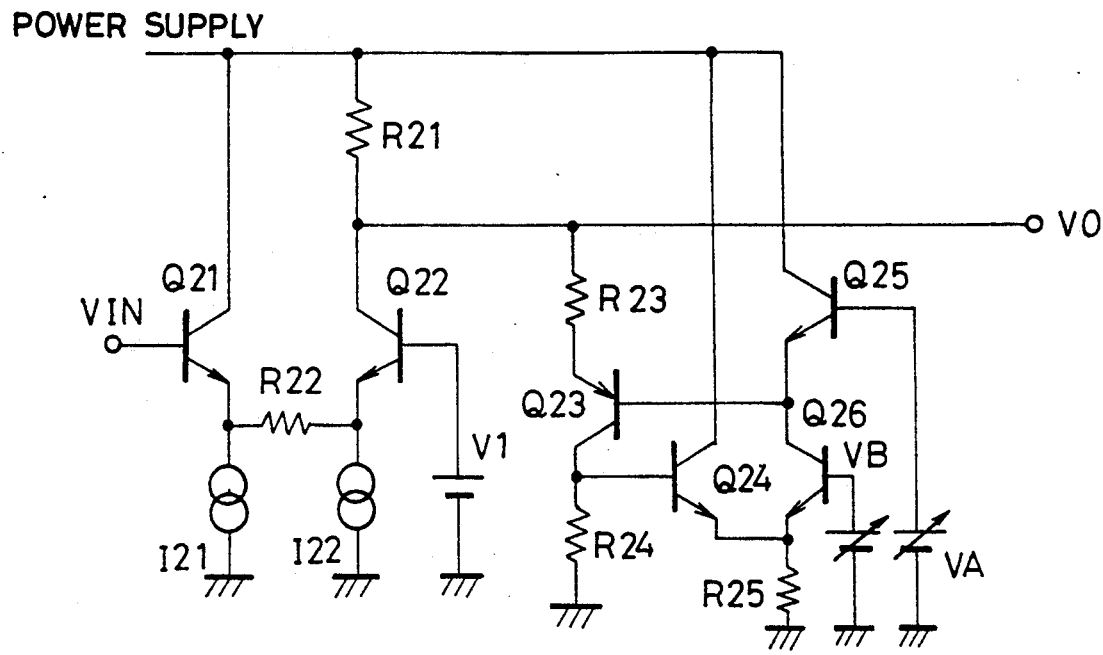
FIG. 7 is a circuit diagram showing a prior gamma correction circuit.
Figure 8:
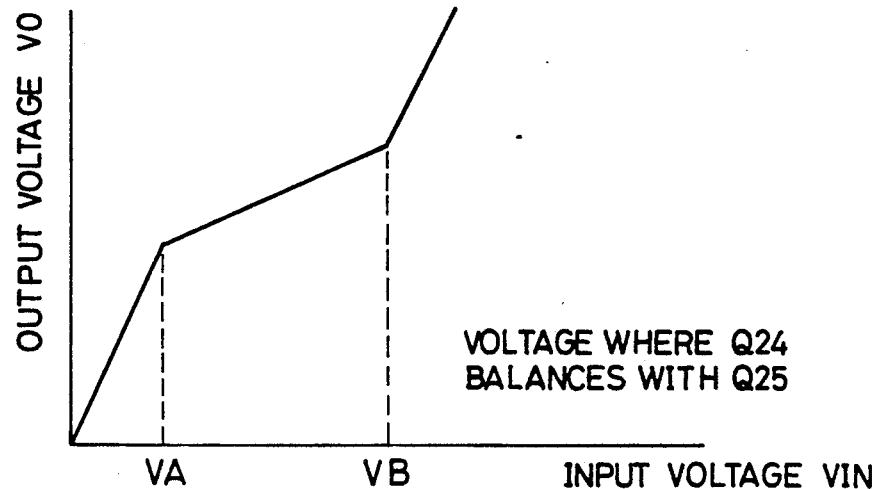
FIG. 8 is a graph showing an input/output characteristic of the gamma correction circuit of FIG. 8.

When the input voltage VIN exceeds VB, the current Ib becomes constant, resulting in Δ Ic=Δ Ia, so that the amplification factor returns to R1/R2. FIG. 4 shows the input/output characteristic of this gamma correction circuit represented graphically, which is similar to the gamma correction characteristic shown in FIG. 6, required for a gamma correction circuit for a liquid crystal display device. By setting VA and VB to various values, a desired gamma correction characteristic can be obtained.

In the current control circuit 1 of this embodiment, a necessary characteristic is obtained by comparing the input voltage VIN with the predetermined voltages VA and VB. Since there is a definite relation between the input voltage and the output voltage of the amplifier, it is also possible to obtain a characteristic required of the current control circuit by comparing the output voltage VO with the specified voltages.

Many widely different embodiments of the present invention may be constructed without departing from the spirit and scope of the present invention. It should be understood that the present invention is not limited to the specific embodiment in the specification, except as defined in the appended claims.

What is claimed is:

1. A gamma correction circuit comprising:
   first means for generating a first current which decreases as an input voltage increases;
   second means for generating a second current which is zero when said input voltage is below a first set value, increases as said input voltage increases when said input voltage is in a range from said first set value to a second set value, and becomes constant when said input voltage exceeds said second set value; and
   third means for generating a voltage proportional to a sum of said first and second currents.

2. A gamma correction circuit according to claim 1, wherein said first means comprises a differential amplifier having a first transistor which receives said input voltage at a base thereof and a second transistor which receives a constant voltage at a base thereof.

3. A gamma correction circuit according to claim 2, wherein said second means comprises a current mirror circuit including two transistors whose bases are connected to each other, said second current flowing to collectors of said two transistors included in said current mirror circuit.

4. A gamma correction circuit according to claim 3, wherein said third means comprises a transistor having a base which is applied with a constant voltage, a collector which is connected to a power-supply line through a resistor, and an emitter which is connected to a collector of said second transistor and to a collector of one of said two transistors included in said current mirror circuit.

* * * * *